United States Patent
Sakamoto

(10) Patent No.: US 9,923,333 B2
(45) Date of Patent: Mar. 20, 2018

(54) CONTROL METHOD, CONTROL DEVICE, AND LIGHT SOURCE DEVICE

(71) Applicant: FUJIKURA LTD., Tokyo (JP)

(72) Inventor: Shinichi Sakamoto, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 15/193,511

(22) Filed: Jun. 27, 2016

(65) Prior Publication Data

US 2016/0308328 A1    Oct. 20, 2016

Related U.S. Application Data

(63) Continuation of application No. PCT/JP2015/051882, filed on Jan. 23, 2015.

(30) Foreign Application Priority Data

Jan. 24, 2014    (JP) .................................. 2014-011858

(51) Int. Cl.
*H01S 3/131* (2006.01)
*H01S 3/067* (2006.01)
(Continued)

(52) U.S. Cl.
CPC ............ *H01S 3/1312* (2013.01); *H01S 3/067* (2013.01); *H01S 3/09415* (2013.01);
(Continued)

(58) Field of Classification Search
CPC ........ H01S 3/067; H01S 3/1312; H01S 3/131; H01S 5/0687
(Continued)

(56) References Cited

U.S. PATENT DOCUMENTS 5,546,221 A    8/1996  Harasawa
5,738,612 A    4/1998  Tsuda
(Continued)

FOREIGN PATENT DOCUMENTS

JP    4-3029 A    1/1992
JP    5-252116 A    9/1993
(Continued)

OTHER PUBLICATIONS

International Search Report dated Mar. 31, 2015, issued in counterpart International Application No. PCT/JP2015/051882 (1 page).
(Continued)

*Primary Examiner* — Tuan Nguyen

(74) *Attorney, Agent, or Firm* — Westerman, Hattori, Daniels & Adrian, LLP

(57) ABSTRACT

A control method of the present invention is a control method of controlling a fiber laser including a plurality of LD modules constituting a plurality of groups. The control method includes the steps of: (a) detecting an intensity of laser light outputted from the fiber laser; and (b) controlling a driving current so that, in a case where the intensity of the laser light which intensity has been detected in the step (a) is lower than a predetermined lower limit threshold, a driving current for LD modules in a specific group among the plurality of groups is increased.

17 Claims, 8 Drawing Sheets

(51) Int. Cl.
*H01S 3/0941* (2006.01)
*H01S 5/042* (2006.01)
*H01S 5/0687* (2006.01)
*H01S 5/40* (2006.01)
*H01S 5/068* (2006.01)
*H01S 5/0683* (2006.01)
*H01S 3/094* (2006.01)
*H01S 3/13* (2006.01)

(52) U.S. Cl.
CPC ............ *H01S 3/1301* (2013.01); *H01S 5/042* (2013.01); *H01S 5/0683* (2013.01); *H01S 5/0687* (2013.01); *H01S 5/06825* (2013.01); *H01S 5/4012* (2013.01); *H01S 5/4025* (2013.01); *H01S 3/09408* (2013.01); *H01S 3/094053* (2013.01); *H01S 3/1305* (2013.01)

(58) Field of Classification Search
USPC .................... 372/29.011, 6, 23; 315/312
See application file for complete search history.

(56) References Cited

U.S. PATENT DOCUMENTS

| | | | |
|---|---|---|---|
| 5,859,938 A | 1/1999 | Nabeyama et al. | |
| 6,266,466 B1 | 7/2001 | Nabeyama et al. | |
| 2001/0050937 A1* | 12/2001 | Hori | H01S 3/038 372/55 |
| 2007/0253145 A1* | 11/2007 | Kurozumi | C01G 23/006 361/321.4 |
| 2008/0049303 A1 | 2/2008 | Nakata | |
| 2010/0033508 A1* | 2/2010 | Mizushima | G09G 3/3406 345/690 |
| 2011/0148328 A1* | 6/2011 | Joseph | F21K 9/00 315/312 |
| 2013/0010820 A1* | 1/2013 | Curtis | G02B 27/48 372/23 |

FOREIGN PATENT DOCUMENTS

| | | | |
|---|---|---|---|
| JP | 10-12954 A | | 1/1998 |
| JP | 2003-338660 A | | 11/2003 |
| JP | 2004-214225 A | | 7/2004 |
| JP | 2005-317841 | * | 11/2005 |
| JP | 2005-317841 A | | 11/2005 |
| JP | 2006-165298 A | | 6/2006 |
| JP | 2008-52001 A | | 3/2008 |
| JP | 2011-187825 A | | 9/2011 |

OTHER PUBLICATIONS

Office Action dated Feb. 7, 2017, issued in counterpart Japanese Patent Application No. 2015-559138, with English translation. (9 pages).

JP Allowance dated Sep. 12, 2017, issued in counterpart Japanese Application No. 2015-559138, with English translation (5 pages).

Extended Search Report dated Jan. 13, 2017, issued in counterpart European Application No. 15740832.9 (9 pages).

* cited by examiner

CONTROL METHOD, CONTROL DEVICE, AND LIGHT SOURCE DEVICE

CROSS-REFERENCE TO RELATED APPLICATIONS

This application is a Continuation of PCT International Application No PCT/JP2015/051882 filed in Japan on Jan. 23, 2015, which claims the benefit of Patent Application No. 2014-011858 filed in Japan on Jan. 24, 2014, the entire contents of which are hereby incorporated by reference.

TECHNICAL FIELD

The present invention relates to (i) a control method for controlling a driving current for emitting excitation light, (ii) a control device, and (iii) a light source device.

BACKGROUND ART

There has conventionally been known a fiber laser for generating high-power laser light by (i) introducing, into an amplifying optical fiber, excitation light emitted from a laser diode laser light source) and (ii) amplifying laser light in the amplifying optical fiber. Such a fiber laser can generate higher-power laser light by, particularly, (i) combining a plurality of beams of excitation light emitted from a plurality of laser diodes and (ii) introducing the combined excitation light into the amplifying optical fiber. The high-power laser light which has been outputted from such a fiber laser is used in, for example, laser processing or the like.

According to a method disclosed in Patent Literature 1, a fiber laser device including a plurality of laser diodes which emit excitation light controls individual driving currents for the respective plurality of laser diodes. This allows the plurality of laser diodes to be uniform in load (e.g., an electric current flowing in the laser diodes, a temperature of the laser diodes themselves or an ambient temperature of the laser diodes, and the like). With the method, even in a case where the plurality of laser diodes have individual differences in light emission efficiency, calorific value, or the like, it is possible to uniformize lives of the plurality of laser diodes by uniformizing loads on the plurality of laser diodes.

According to a method disclosed in Patent Literature 2, in a multiport optical amplifier including a plurality of excitation light source elements, a driving current for an excitation light, source element which is deteriorated is reduced and a driving current for an excitation light source element which is not deteriorated is increased. This allows the multiport optical amplifier to maintain an intended excitation light power. With the method, it is possible to uniformize lives of the plurality of excitation light source elements as much as possible, so that a usable period of the multiport optical amplifier can be maximally extended.

CITATION LIST

Patent Literatures

Patent Literature 1
Japanese Patent Application Publication Tokukai No. 2011-187825 (Publication date: Sep. 22, 2011)
Patent Literature 2
Japanese Patent Application Publication Tokukai No. 2006-165298 (Publication date: Jun. 22, 2006)

SUMMARY OF INVENTION

Technical Problem

However, according to the techniques disclosed in Patent Literatures 1 and 2, since the plurality of laser light sources are caused to have uniform lives, the plurality of laser light sources are likely to be deteriorated in a similar manner. Therefore, in a case where any of the plurality of laser light sources needs to be replaced, all of the plurality of laser light sources are likely to need to be simultaneously replaced. This is because in a case where only a laser light source which needs to be replaced is replaced each time when the replacement is necessary instead of simultaneously replacing all of the plurality of laser light sources, a replacement operation is not easy and it is likely that replacement operations are needed one after another, and therefore much time and cost are required.

Meanwhile, according to the method in which all of the plurality of laser light sources are simultaneously replaced, a laser light, source which does not actually need to be replaced may be replaced, and this may cause a reduction in use efficiency of the plurality of laser light sources. Such a problem may similarly occur in a light source device in which an LD module including a plurality of laser diodes is employed as a laser light source. In particular in the LD module including the plurality of laser diodes, it is highly possible that the entire LD module needs to be replaced even though only one or some of the plurality of laser diodes have broken down, and this may further reduce use efficiency of the plurality of laser diodes.

The present invention is accomplished in view of the problems, and an object of the present invention is to provide a light source device capable of increasing use efficiency of a laser light source while reducing time and labor required for replacement of the laser light source.

Solution to Problem

In order to attain the object, a control method in accordance with the present invention is a control method of controlling a light source device which (i) includes a plurality of laser light sources constituting each of a plurality of groups and (ii) emits laser light from the plurality of laser light sources, the control method including the steps of: (a) detecting an intensity of the laser light or another intensity of another laser light, the another intensity changing in accordance with the intensity of the laser light; and (b) controlling a driving current so that, in a case where the intensity or the another intensity which has been detected in the step (a) is lower than a predetermined lower limit threshold, only a driving current for laser light sources belonging to a specific group predetermined among the plurality of groups is increased.

Advantageous Effects of Invention

The present invention can provide a light source device capable of increasing use efficiency of a laser light source while reducing time and labor required for a replacement of the laser light source.

DESCRIPTION OF EMBODIMENTS

Embodiment 1

The following description will discuss a fiber laser in accordance with an embodiment of the present invention with reference to the attached drawings.

[Configuration of Fiber Laser 100]

Figure 1:
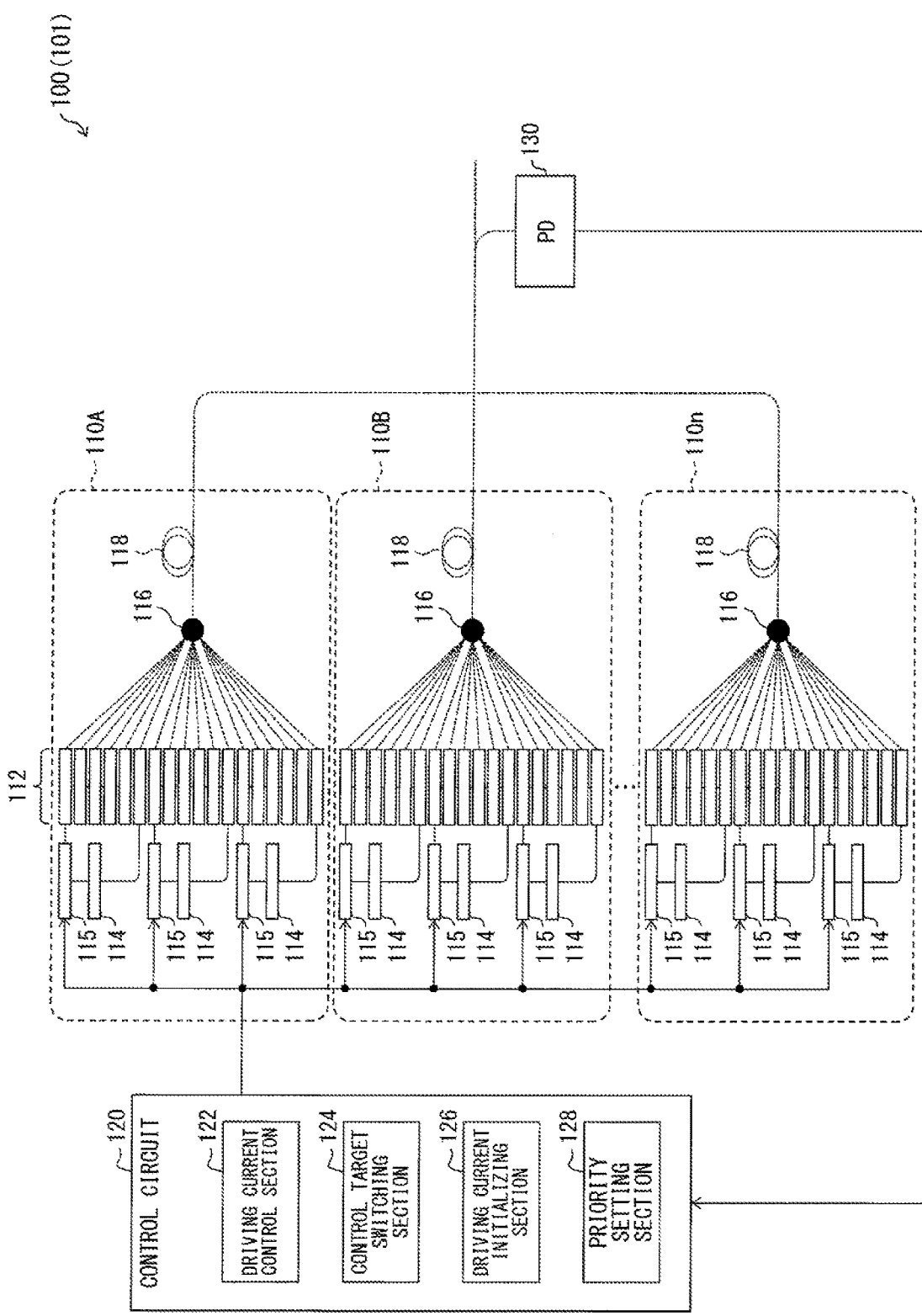
FIG. 1 is a view illustrating a configuration of a fiber laser in accordance with an embodiment of the present invention.

The following description will first discuss, with reference to FIG. 1, a configuration of a fiber laser 100 in accordance with an embodiment of the present invention. FIG. 1 is a view illustrating the configuration of the fiber laser 100 in accordance with the embodiment of the present invention.

The fiber laser 100 illustrated in FIG. 1 is a device for (i) generating output light, which is high-power laser light, by utilizing amplifying action on excitation light (laser light) emitted from a plurality of laser diode (LD) modules (laser light sources) and (ii) outputting the output light. As illustrated in FIG. 1, the fiber laser 100 includes a plurality of sub-units 110. Each of the plurality of sub-units 110 includes a plurality of LD modules 112, a plurality of LD power sources 114, a plurality of LD drivers 115, a pump combiner 116, and an amplifying fiber 118. Note that the amplifying fiber 118 can be replaced with a YAG crystal. That is, the fiber laser can be replaced with a YAG laser.

In an example illustrated in FIG. 1, the fiber laser 100 includes n (n is a natural number not less than 1) sub-units 110 (sub-units 110A, 110B, . . . , 110n). In the example illustrated in FIG. 1, each of the sub-units 110 includes 18 LD modules 112, three LD power sources 114, and three LD drivers 115. That is, each of the sub-units 110 is configured such that six LD modules 112 are driven by a single LD power source 114 and a single LD driver 115.

Each of the plurality of LD modules 112 is a so-called multi-chip LD module including a plurality of laser diodes. Each of the plurality of laser diodes is driven, by a driving current which is supplied from the LD power source 114, based on control by the LD driver 115. This causes each of the plurality of laser diodes to generate excitation light having an intensity corresponding to the driving current supplied from the LD power source 114. The rays of excitation light which have been generated by the respective plurality of laser diodes are combined by the LD module 112 into high-power excitation light, and the high-power excitation light is then emitted from the LD module 112. Similarly, in each of the sub-units 110, high-power excitation light is emitted from each of the plurality of LD modules 112.

Even in a case where one of the plurality of laser diodes has broken down, each of the plurality of LD modules 112 can output excitation light by driving the other ones of the plurality of laser diodes in a so-called short-circuit mode. For example, in a case where, in an LD module 112 including ten laser diodes, one of the ten laser diodes has broken down, it is possible to output, by driving the other nine laser diodes, excitation light having an intensity that is nine-tenths of an intensity obtained before the breakdown. Note, however, that it is also possible to output, by enhancing the driving current, excitation light having an intensity which is identical with the intensity obtained before the breakdown.

In each of the plurality of sub-units 110, rays of excitation light emitted from the plurality of LD modules 112 are introduced into the pump combiner 116 via optical fibers, combined by the pump combiner 116 into combined excitation light, and the combined excitation light, is then introduced into the amplifying fiber 118. In the amplifying fiber 118, high-power laser light is generated by amplifying the combined excitation light, and then the high-power laser light is output from the sub-unit 110.

For example, the amplifying fiber 118 is an optical fiber (a double clad fiber) in which a laser medium (e.g., a rare earth ion) that (i) absorbs excitation light and (ii) shifts to a population inversion state is added to a core. While propagating in the amplifying fiber 118, excitation light that has entered the amplifying fiber 118 causes the laser medium added to the core to shift to the population inversion state. Then, laser light which has been induced and emitted from the laser medium that had shifted to the population inversion state (i) resonates and is recursively amplified in the amplifying fiber 118 and (ii) is then emitted from the amplifying fiber 118.

Similarly, rays of high-power laser light are outputted from the respective plurality of sub-units 110 the fiber laser 100. The rays of high-power laser light outputted from the respective plurality of sub-units 110 are combined by a combiner or the like (not illustrated) into output light having a higher power, and the output light thus generated is then outputted from the fiber laser 100.

(Control Circuit 120 and PD 130)

The fiber laser 100 illustrated in FIG. 1 further includes a control circuit 120 and a photo diode (PD) 130. The control circuit 120 and the PD 130 each function as a control device for controlling a light source device (i.e., the plurality of sub-units 110). The control circuit 120 controls a driving current for driving the LD modules 112. The PD 130 is a so-called light intensity monitor and detects an intensity of output light outputted from the fiber laser 100. The PD 130 is connected to the control circuit 120 by a communication cable or the like, and the intensity of the output light detected by the PD 130 is fed back to the control circuit 120. The control circuit 120 controls, based on the intensity of the output light fed back from the PD 130, the driving current, so that the output light maintains a predetermined intensity.

For example, in a case where a defect has occurred in one of laser diodes of any of the LD modules 112, an intensity of output light outputted from the fiber laser 100 may decrease due to a decrease in intensity of excitation light outputted from the LD module 112. In such a case, the PD 130 detects the intensity of the output light and then feeds back the intensity thus detected to the control circuit 120. In accordance with the feedback, the control circuit 120 increases a driving current for LD modules 112 belonging to a specific group so that the intensity of the output light becomes a predetermined intensity. In a case where the intensity of the output light further decrease, the control circuit 120 further increases the driving current for the LD modules 112 belonging to the specific group.

In this specification, a "group" is a unit of control of a driving current for LD modules and is predefined in the fiber laser 100. Each group includes one or more LD modules 112, and a driving current for one or more LD modules 112 of one group can be controlled independently from another group. For example, in the fiber laser 100 illustrated in FIG. 1, each of the sub-units 110 is regarded as a group. That is, in the fiber laser 100 illustrated in FIG. 1 including the n sub-units 110, n groups are set accordingly, and each of the n groups includes 18 LD modules.

The control circuit 120 includes a driving current control section 122, a control target switching section 124, a driving current initializing section 126, and a priority setting section 128. The control circuit 120 includes, for example, a central processing unit (CPU), a read only memory (ROM), a random access memory (RAM), and the like, and each function of the control circuit 120 is carried out in a case were a program stored in the ROM, the RAM, or the like is executed by the CPU. Note, however, that the each function of the control circuit 120 can be carried out an integrated circuit such as a field programmable gate array (FPGA) or an application specific integrated circuit (ASIC).

In a case where an intensity of output outputted from the fiber laser 100 which intensity has been detected by the PD 130 is less than a predetermined lower limit threshold, the driving current control section 122 increases a driving current for LD modules 112 belonging to a specific group among the plurality of groups. This causes an increase in intensity of excitation light, which is emitted from the LD modules 112 belonging to the specific group, and an intensity of output light outputted from the fiber laser 100 is consequently maintained at a given intensity.

In a case where the driving current for the LD modules 112 belonging to the specific group is gradually increased and consequently reaches a predetermined upper limit threshold, the control target switching section 124 switches, to another group which is not the specific group, a target group for which a driving current is to be increased. In particular, the control target switching section 124 switches the target group in a predetermined descending order of priority.

The upper limit threshold can be, for example, a maximum rated current for an LD module, but the upper limit threshold is not limited to this. Note, however, that, in a case where the upper limit, threshold is set to a value not more than the maximum rated current, at least an operation of the LD module is guaranteed, and it is therefore possible to continue to use the LD module until the LD module is replaced.

In a case where at least one of components of the specific group has been replaced after the driving current for the LD modules 112 belonging to the specific group had reached the upper limit threshold, the driving current initializing section 126 restores, to an initial current, the driving current for the LD module 112 belonging to the specific group. The priority setting section 128 sets an order of priority so that the specific group, in which at least one of the components has been replaced, has a lowest priority for being selected as a target group for which a driving current is to be increased.

For example, in the fiber laser 100 illustrated in FIG. 1, each of the sub-units 110 is regarded as a group, and therefore replacement of component is to be carried out for each of the sub-units 110. In a case where such replacement of component is carried out in a sub-unit 110, (i) the driving current initializing section 126 restores, to an initial current, a driving current for the sub-unit 110 in which the replacement of component has been carried out and (ii) the priority setting section 128 sets, to lowest, a priority of the sub-unit 110 in which the replacement of component has been carried out.

In each of the sub-units 110, a plurality components (including a plurality of LD modules 112) are integrally provided. According to the fiber laser 100 in accordance with Embodiment 1, it is therefore possible to integrally replace all components constituting a sub-unit 110 by replacing the sub-unit 110. Note, however, that, in a case where replacement can be carried out for each of the components in the sub-unit 110, it is also possible to replace only a component which needs to be replaced (e.g., only an LD module 112, if such a component is deteriorated).

The control circuit 120 can recognize the replacement based on, for example, a manual input which is carried out by an operator. Alternatively, the control circuit 120 can automatically recognize the replacement by carrying out intercommunication with the sub-units 110. In the latter case, the control circuit 120 can automatically recognize the replacement through, for example, a change in ID of an LD module, ID of a sub-unit, or the like.

[Procedure for First Process]

Figure 2:
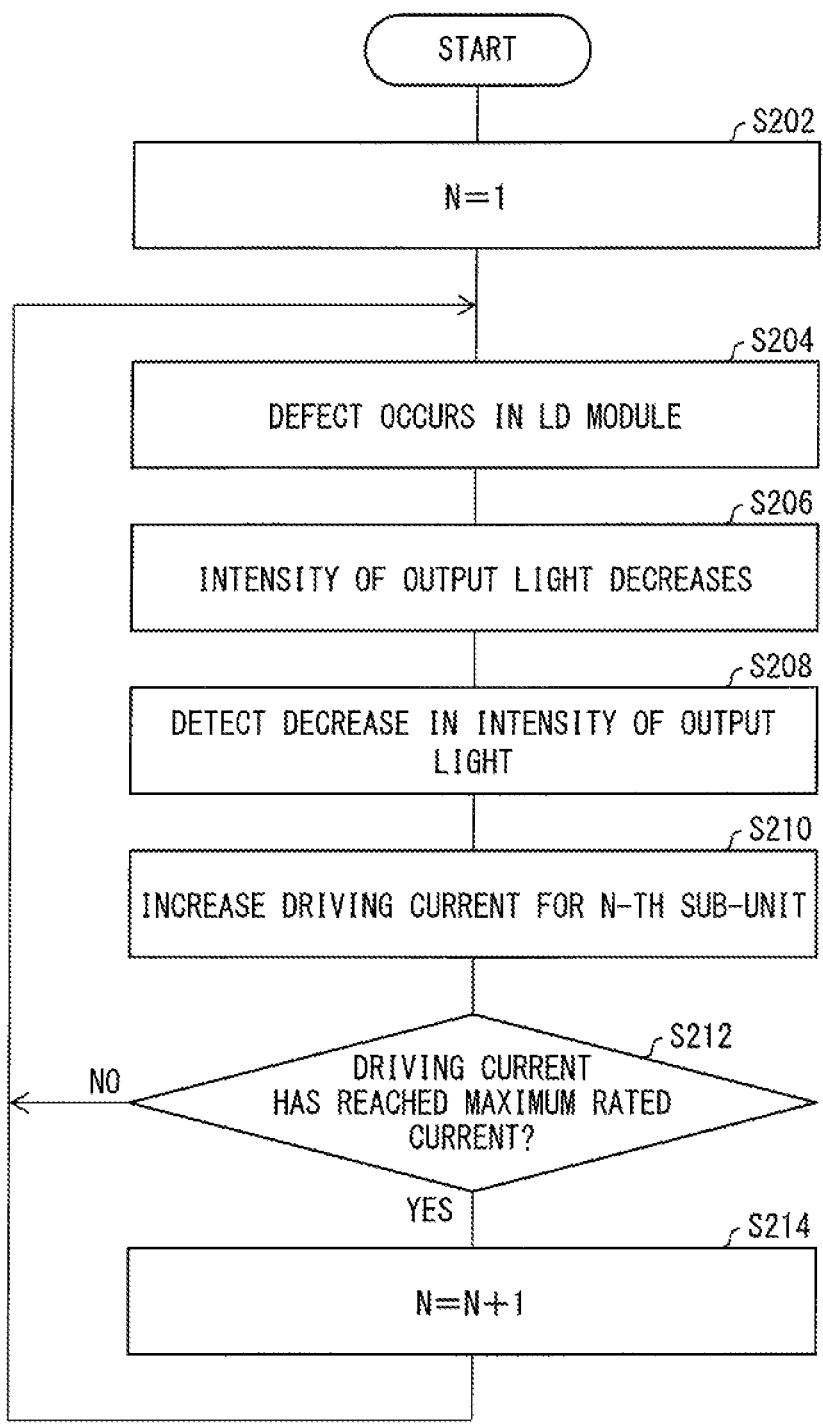
FIG. 2 is a flow chart showing a procedure for a first process to be carried out by the fiber laser in accordance with the present embodiment.

FIG. 2 is a flow chart showing a procedure for a first process to be carried out by the fiber laser 100 in accordance with Embodiment 1. The first process is a process to be carried out by the fiber laser 100 in order to correct a decrease in intensity of output light outputted from the fiber laser 100.

(Detection Step)

The control circuit 128 sets in advance "1" as a variable N indicative of a number which is assigned to a sub-unit 110 for which a driving current is to be controlled (step S202). In a case where a defect has occurred in any of the LD modules 112 in the fiber laser 100 (step S204), an intensity of output light outputted from the fiber laser 100 decreases accordingly (step S206). The PD 130 detects the decrease in intensity of the output light (step S208).

(Driving Current Control Step)

The control circuit 120 (the driving current control section 122) increases, in accordance with the decrease in intensity of the output light which decrease has been detected by the PD 130, a driving current for LD modules 112 belonging to an n-th sub-unit 110 (i.e., an n-th group) so that the intensity of the output light becomes a given intensity (step S210). The control circuit 120 then determines whether or not the driving current for the LD modules 112 belonging to the n-th sub-unit 110 has reached the maximum rated current (step S212).

(Switching Step)

In a case where the control circuit 120 has determined in the step S212 that "the driving current had reached the maximum rated current" (step S212: Yes), the control circuit 120 (the control target switching section 124) adds "1" to the variable N (step S214). That is, the control circuit 120 (the control target switching section 124) switches, to an (N+1)th sub-unit 110 (i.e., an (N+1)th group), a sub-unit 110 for which a driving current is to be controlled. The fiber laser 100 then returns the process to the step S204.

Meanwhile, in a case where the control circuit 120 has determined in the step S212 that "the driving current had not reached the maximum rated current" (step S212: No), the fiber laser 100 returns the process to the step S204 without changing the variable N. That is, until the control circuit 120 determines that "the driving current has reached the maximum rated current", the control circuit 120 does not switch the sub-unit 110 for which a driving current is to be controlled.

[Procedure for Second Process]

Figure 3:
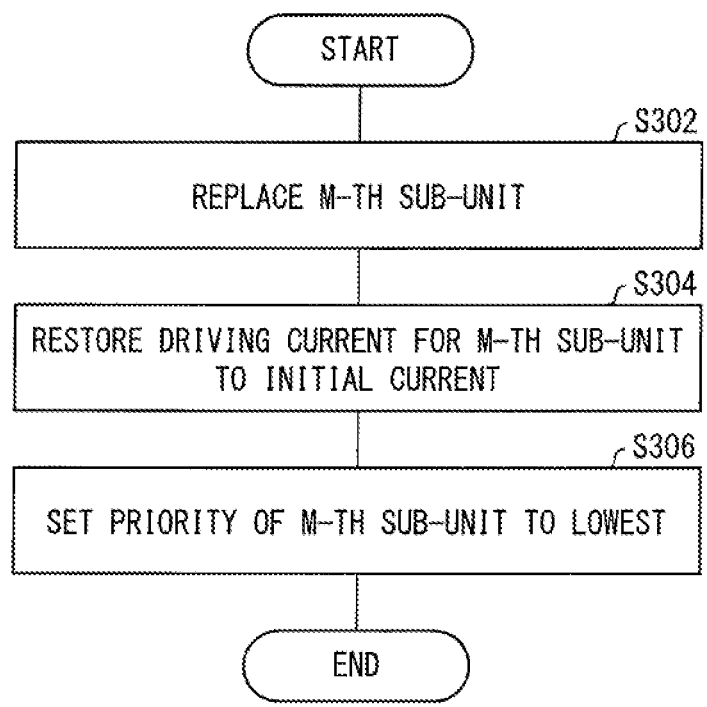
FIG. 3 is a flow chart showing a procedure for a second process to be carried out by the fiber laser in accordance with the present embodiment.

FIG. 3 is a flow chart showing a procedure for second process to be carried out by the fiber laser 100 in accordance with Embodiment 1. The second process is a process to be carried out by the fiber laser 100 due to replacement of a sub-unit 110. In the second process, a sub-unit 110 (an m-th sub-unit) in which a component is to be replaced is, for example, a sub-unit 110 for which a driving current has reached the maximum rated current in the first process (see FIG. 2). For example, a driving current for a first sub-unit 110 first reaches the maximum rated current in the first process. Therefore, the first sub-unit 110 can first be a sub-unit 110 in which a component is to be replaced.

(Driving Current Initializing Step)

First, in a case where the m-th sub-unit 110 has been replaced in the fiber laser 100 (step S302), the control circuit 120 (the driving current initializing section 126) restores, to an initial current, a driving current for LD modules 112 belonging to the m-th sub-unit 110 (step S304).

(Priority Setting Step)

The control circuit 120 (the priority setting section 128) then sets the m-th sub-unit 110 to have a lowest priority. This causes the m-th sub-unit 110 to be selected, as a sub-unit 110 for which a driving current is to be increased, after the other sub-units 110 in the processes which are shown in FIG. 2 and carried out after this.

[Example]

Figure 4:
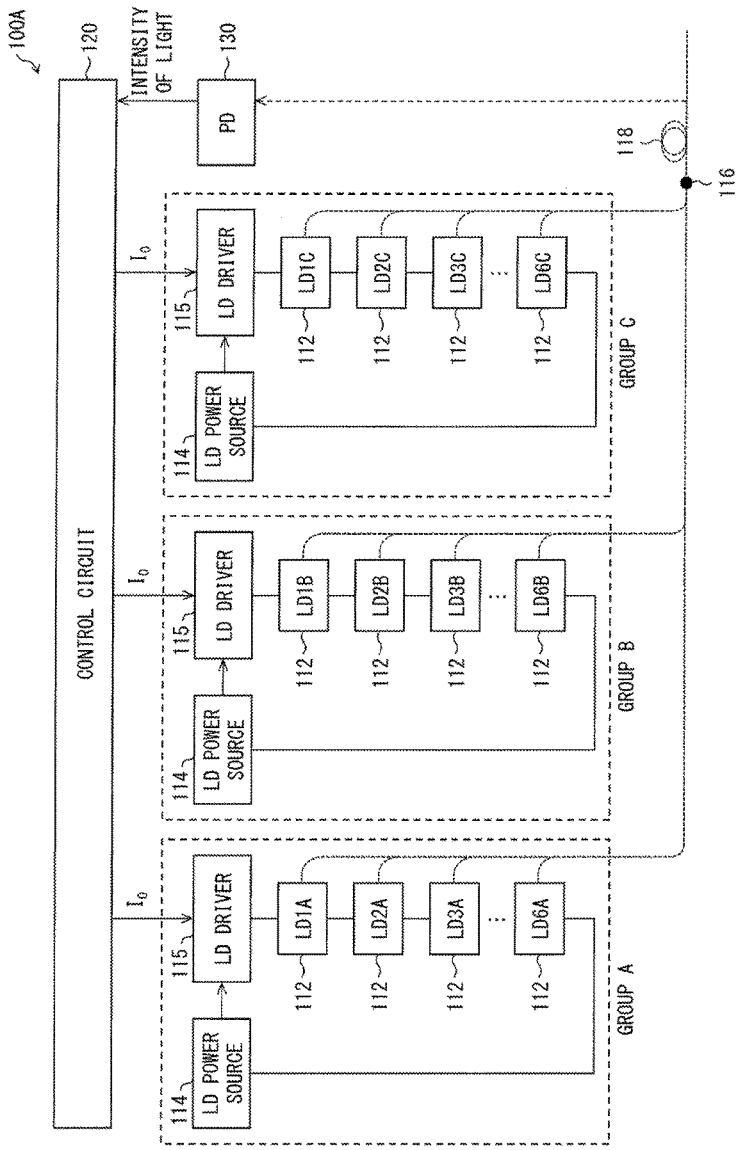
FIG. 4 is a view illustrating a configuration of a fiber laser (in a state in which a defect has not occurred) in accordance with the present example.
Figure 5:
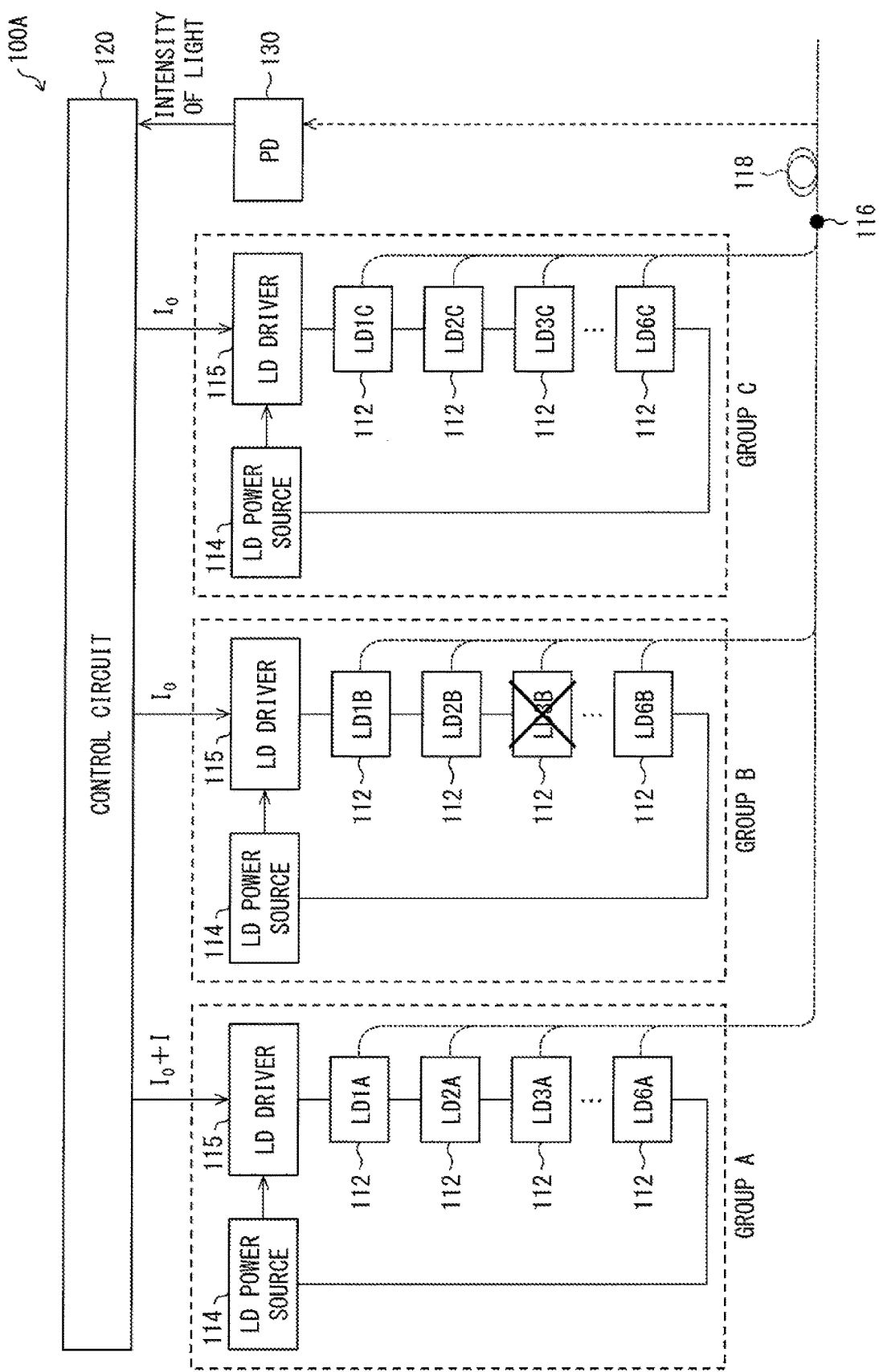
FIG. 5 is a view illustrating the configuration of the fiber laser (in a state in which a defect has occurred) in accordance with the present example.
Figure 6:
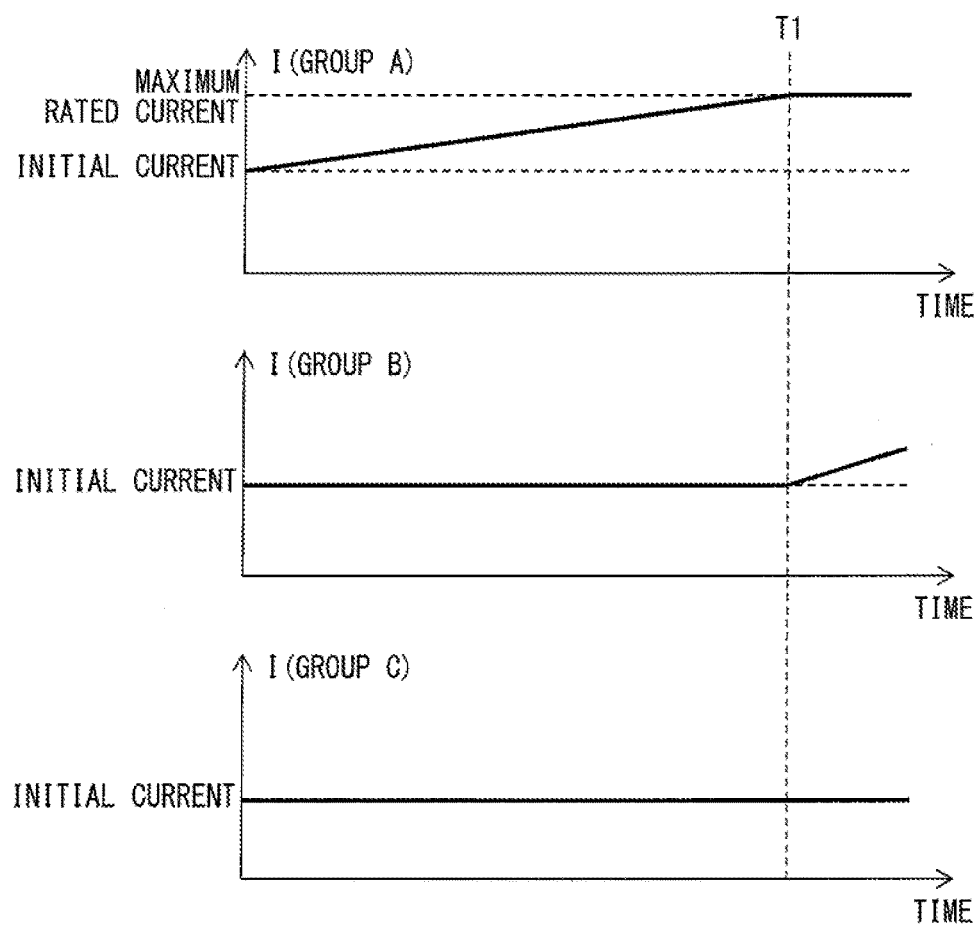
FIG. 6 is a graph showing a temporal change in driving current which is applied to each of groups in the fiber laser in accordance with the present example.

The following description will discuss an example of the fiber laser 100 with reference to FIGS. 4 through 6. FIG. 4 is a block diagram illustrating a configuration of a fiber laser 100A (in a state in which a defect has not occurred) in accordance with the present example. FIG. 5 is a block diagram illustrating the configuration of the fiber laser 100A (in a state in which a defect has occurred) in accordance with the present example. FIG. 6 is a graph showing a temporal change in driving current which is applied to each of groups in the fiber laser 100A in accordance with the present example.

The fiber laser 100A in accordance with the present example has a configuration which is obtained by changing a part of the configuration (particularly, a unit of group) of the fiber laser 100 (see FIG. 1). Components included in the fiber laser 100A have functions similar to those of the fiber laser 100.

As illustrated in FIG. 4, the fiber laser 100A in accordance with the present example includes 18 LD modules 112. The 18 LD modules 112 are grouped in a unit of six LD modules 112, and thus constitute three groups a group A, a group B, a group C).

According to the fiber laser 100A in accordance with the present example, one LD power source 114 and one LD driver 115 are provided for each of the three groups. This allows LD modules 112 belonging to each of the three groups to be controlled independently from the other groups.

Rays of excitation light emitted from the 18 LD modules 112 are combined by a pump combiner 116 into combined excitation light, and the combined excitation light is then introduced into an amplifying fiber 118. This causes high-power laser light to be generated in the amplifying fiber 118 by amplifying the combined excitation light. An intensity of the high-power laser light is detected by a PD 130 and is then fed back to a control circuit 120.

(In Case of Normal Operation)

In a case where no defect occurs in the LD modules 112, the fiber laser 100A in accordance with the present example obtains output light having a given intensity (1 KW) by driving the LD modules 112 by a driving current $I_0$ (initial current: 8 A). Therefore, the control circuit 120 instructs each of LD drivers 115 to drive LD modules 112 by the driving current $I_0$ (initial current: 8 A) while an intensity of the output light which intensity has been detected by the PD 130 is a given intensity (see FIG. 4).

(In Case where Defect Occurs)

Meanwhile, in a case where a defect has occurred in any of the LD modules 112 and the intensity of the output light has decreased, the fiber laser 100A in accordance with the present example maintains the intensity of the output light at a given intensity (1 KW) by increasing a driving current for LD modules 112 belonging to a specific group so that an intensity of excitation light of the specific group increases. For example, in an example illustrated in FIG. 5, the group A is set as a specific group, and a driving current for the group A is increased to a driving current $I_0+I$ in accordance with occurrence of a defect in an LD module 112 (LD3B) of the group B. This allows output light outputted from the fiber laser 100A to be maintained at a given intensity (1 KW). In this case, the control circuit 120 can calculate the increase amount I in driving current based on a decrease amount in intensity of the output light. Alternatively, the control circuit 120 can gradually increase an intensity of the output light while monitoring the intensity of the output light. Note that driving currents for the respective groups B and C are maintained at the driving current $I_0$.

(In Case where Driving Current Reaches Maximum Rated Current)

As shown in FIG. 6, in a case where an intensity of output light has decreased, the control circuit 120 in accordance with the present example increases a driving current for the group A until the driving current for the group A reaches the maximum rated current (15 A). Moreover, in a case where the driving current for the group A has reached the maximum rated current (at a timing T1 shown in FIG. 6), the control circuit 120 switches, to the group B, a target group for which a driving current is to be controlled. Subsequently, in a case where the intensity of the output light has decreased, the control circuit 120 increases the driving current for the group B. As such, each time a driving current, for a target group for which a driving current is to be increased reaches the maximum rated current, the control circuit 120 in accordance with the present example sequentially switches the target group for which a driving current is to be increased.

As described above, the fiber laser 100 in accordance with Embodiment 1 increases a driving current for a specific sub-unit 110 each time an intensity of output light outputted from the fiber laser 100 has decreased. This allows the fiber laser 100 in accordance with Embodiment 1 to stably emit output light having a given intensity, and it is further possible to concentrate, on the specific sub-unit 110, a risk (e.g., acceleration of progress of deterioration, an increase in rate of occurrence of defect, etc.) which is caused due to the increase in driving current.

Therefore, in the fiber laser 100 in accordance with Embodiment 1, necessity of replacement of a component can be concentrated on a specific group. It is therefore only necessary to carry out replacement of components in the unit of group, and this allows a reduction in time and cost which are required for the replacement of the components. Moreover, the above risk does not occur in groups other than the specific group, and this allows components to have a longer life and it is therefore possible to reduce a frequency of replacing the components. Further, in a case where a component is selectively replaced, an operator can recognize in advance a group in which the component needs to be replaced, and this eliminates the need to inspect or disassemble components included in a group in which no component needs to be replaced. This makes it possible to reduce a load required for a replacement operation itself.

In a case where a driving current for a specific group has reached the maximum rated current, the fiber laser 100 in accordance with Embodiment 1 switches, to another group (one of groups for which driving currents have not reached the maximum rated current), a target group for which a driving current is to be increased. With such a control, a driving current for a group for which the driving current has been increased does not exceed the maximum rated current, and this allows the group to continue to operate in a relatively stable manner until the group is replaced.

Embodiment 2

The following description will discuss another embodiment of the present invention with reference to the drawings.

[Configuration of Fiber Laser 101]

As illustrated in FIG. 1, a fiber laser 101 in accordance with Embodiment 2 has a configuration similar to that of the fiber laser 100 described above.

(Control Circuit 120)

As with the case of the fiber laser 100, a driving current control section 122 of a control circuit 120 of the fiber laser 101 increases, in accordance with an intensity of output light which intensity has been fed back from a PD 130, a driving current for LD modules 112 belonging a specific group so that the output light maintains a predetermined intensity. In the fiber laser 101 in accordance with Embodiment 2, the driving current for the LD modules 112 belonging to the specific group is set so as to be higher than a driving current for LD modules belonging to other groups.

In a case where the driving current for the LD modules 112 belonging to the specific group has reached a predetermined upper limit threshold, a control target switching section 124 switches a target group, for which a driving current is to be increased, from the specific group to another group other than the specific group in accordance with a predetermined order of priority.

A driving current initializing section 126 and a priority setting section 128 operate in a manner similar to those of the fiber laser 100.

[Procedure for First Process]

Figure 7:
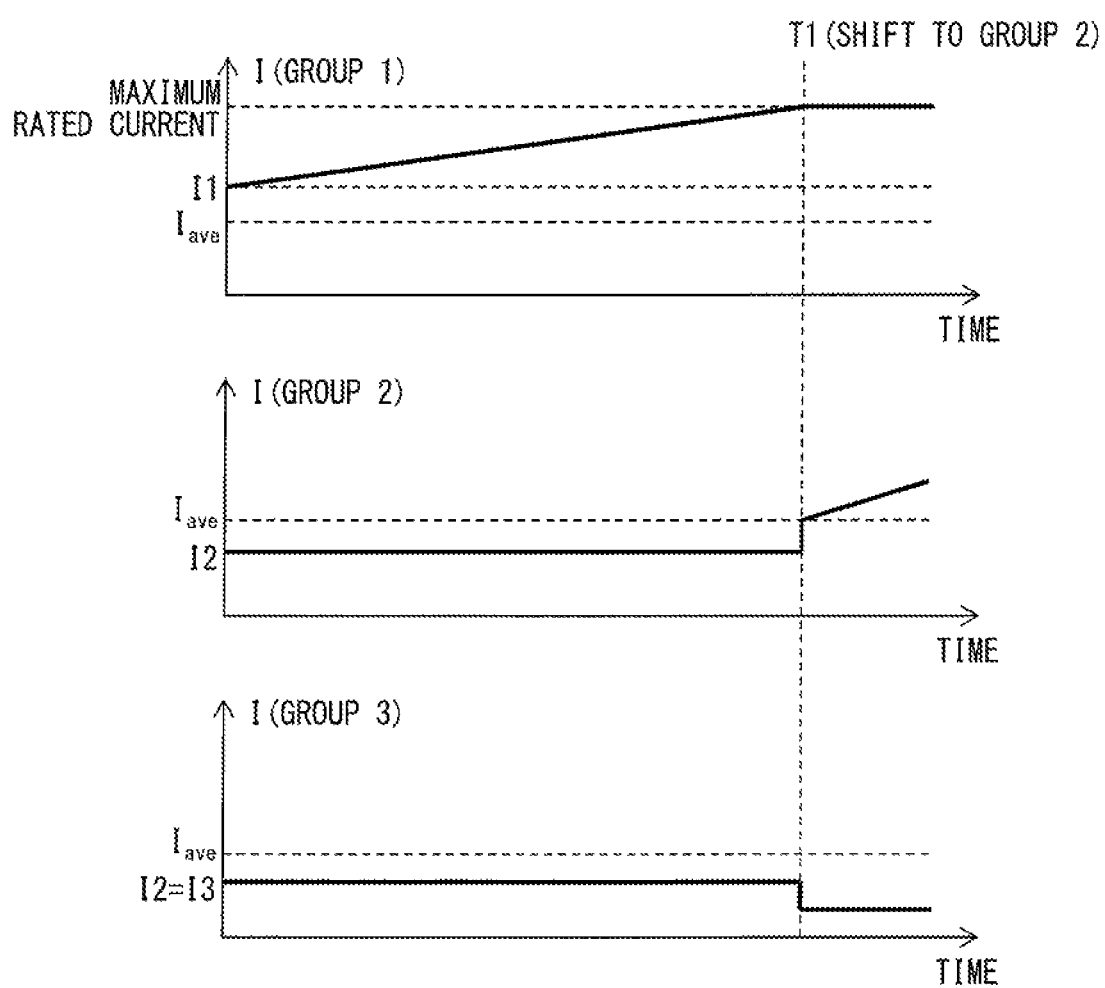
FIG. 7 is a graph showing a temporal change in driving current which is applied to each of groups of fiber lasers in accordance with another embodiment of the present invention.
Figure 8:
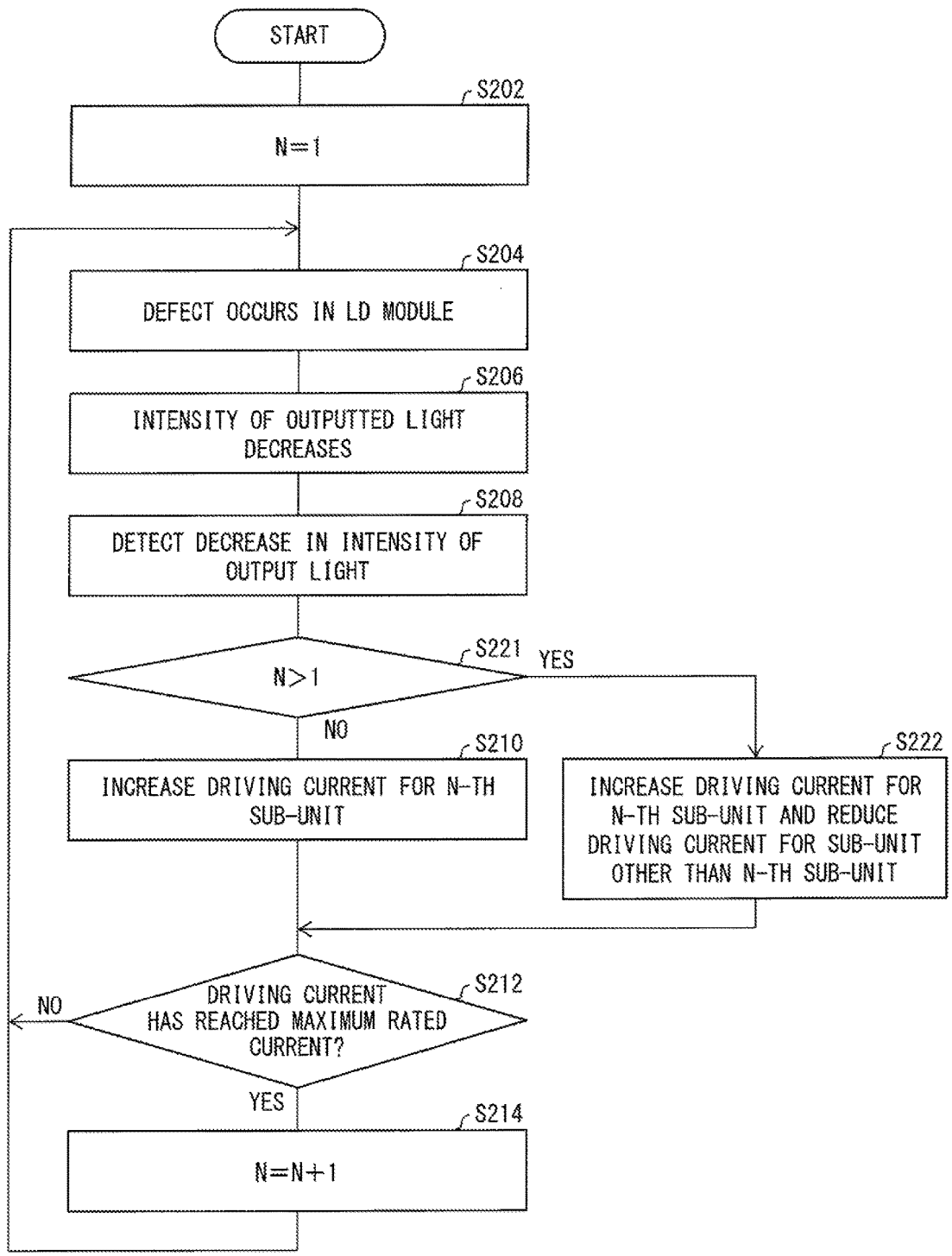
FIG. 8 is a flow chart showing a procedure for a first process to be carried out by the fiber laser in accordance with the another embodiment of the present invention.

FIG. 7 is a graph showing a temporal change in driving current which is applied to each of the groups in the fiber laser 101 in accordance with Embodiment 2. FIG. 8 is a flow chart showing a procedure for a first process to be carried out by the fiber laser 101 in accordance with Embodiment 2.

(Detection Step, Driving Current Control Step, Switching Step)

Processes to be carried out in steps S202 through S208 are similar to those carried out by the fiber laser 100 illustrated in FIG. 2.

In a case where the control section 120 has determined in the step S208, in accordance with a detection result given from PD 130, that an intensity of output light had decreased from a given intensity, the driving current control section 122 carries out the following process. That is, in a case where N=1 (step S221), the driving current control section 122 increases a driving current for a first sub-unit (group 1, a specific group) 110 so that the intensity of the output light becomes a given intensity (step S210). The driving current control section 122 repeats the processes in the steps S202 through S208, S221, and S210 until the driving current for the first sub-unit 110 reaches the maximum rated current (step S212).

Then, in a case where the driving current for the first sub-unit 110 has reached the maximum rated current in the step S212, the control target switching section 124 (i) switches, to a given second sub-unit (group 2, another group) 110, a target sub-unit for which a driving current is to be controlled (step S214), and then (ii) returns the process to the step S204.

In this case, in a state in which the intensity of the output light is still less than the given intensity (steps S202 through S208), the driving current for the second sub-unit (group 2, another group) 110 is increased (because N=2 (N>1) in the step S221) and a driving current for a sub-unit (group 3) 110 which is a other than the second sub-unit 110 is reduced (step S222). Note, however, that a target sub-unit 110 for a driving current is to be reduced is a sub-unit 110 which is not a sub-unit 110 (in this case, the first sub-unit 110) for which a driving current has reached the maximum rated current.

In this case, as illustrated in FIG. 7, an initial driving current for a sub-unit 110 which is the group 2 after the switching of the target sub-unit 110 is set to a current which is higher, by a certain degree, than a final driving current for the sub-unit 110 which is the group 2 before the switching. Simultaneously, an initial driving current for a sub-unit 110 which is the group 3 after the switching of the target sub-unit 110 is set to a current which is lower, by a certain degree, than a final driving current for the sub-unit 110 which is the group 3 before the switching. Subsequently, processes in and subsequent to the step S212 are similarly repeated.

[Procedure for Second Process]

A procedure for a second process in the fiber laser 101 is similar to that in the fiber laser 100 (shown in FIG. 3).

[Example]

The configuration illustrated in FIGS. 4 and 5 of the example mentioned above is similarly applicable to the fiber laser 101.

(In Case of Normal Operation)

The fiber laser 101 in accordance with the present example is configured such that, in a case where no defect occurs in the LD modules 112, a driving current for the LD modules 112 is controlled so that output light having a given intensity (e.g., 1 KW) is obtained. In this case, an initial driving current for the LD modules 112 in the group 1 (a specific group) is set to a current higher than an average current lave for the LD modules 112 in the groups 1 through 3. Initial driving currents for the LD modules 112 in the groups 2 and 3 (the other groups) are set to currents lower than the average current lave.

(In Case where Defect Occurs)

In a case where a defect has occurred in any of the LD modules 112 and an intensity of output light has decreased, the fiber laser 101 carries out the above described control with respect to the LD modules 112 so that the output light is maintained at a given intensity (e.g., 1 KW).

As described above, in a case where an intensity of output light has decreased, the fiber laser 101 in accordance with Embodiment 2 increases a driving current for only a specific sub-unit 110, as with the fiber laser 100. This allows the fiber laser 101 to (i) stably emit output light having a given intensity and (ii) concentrate, on the specific sub-unit 110, a risk (e.g., acceleration of progress of deterioration, an increase in rate of occurrence of defect, etc.) which is caused due to the increase in driving current.

In a case where the driving current for the specific sub-unit 110 has reached the maximum rated current, the fiber laser 101 (i) switches a sub-unit 110, for which a driving current is to be increased, from a first sub-unit to a second sub-unit, and (ii) reduces a driving current for a sub-unit 110 which is not the second sub-unit and for which a driving current has not reached the maximum rated current. In this case, an initial driving current for a sub-unit 110 which is the group 2 after the switching of the target sub-wilt 110 is set to a current which is higher, by a certain degree, than a final driving current for the sub-unit 110 which is the group 2 before the switching. Simultaneously, an initial driving current for a sub-unit 110 which is the group 3 after the switching of the target sub-unit 110 is set to a current which is lower, by a certain degree, than a final driving current for the sub-unit 110 which is the group 3 before the switching.

As such, in a case where the target sub-unit 110 for which a driving current is to be increased is switched from the specific sub-unit 110 to another sub-unit 110, it is possible to concentrate, on the another sub-unit 110 to which the target sub-unit 110 has been thus switched, a risk caused due to the increase in driving current, as with the specific sub-unit 110. Therefore, necessity of replacement of a component can be concentrated on the group.

Moreover, as shown in FIG. 7, according to the fiber laser 101, an initial driving current or a first sub-unit 110 for which a driving current is to be increased is set to a current higher than an initial driving current for another sub-unit 110 for which a driving current not to be increased. This makes it possible to further surely concentrate, on the first sub-unit (a specific group) 110, a risk (a risk of requiring replacement of components) which is caused due to the increase in driving current.

FIG. 7 shows an example in which the above configuration is applied to the fiber laser 101. Note, however, that the configuration is not essential to the fiber laser 101. Moreover, the configuration is also applicable to the fiber laser 100 described earlier.

The fiber lasers 100 and 101 can be configured to (i) initially drive the sub-units (groups) 110 at a rated current and then (ii) carry out the first process in a case where some degree or more of defect has been detected in any of the sub-units 110. For example, the fiber lasers 100 and 101 can be configured to carry out the first process in a case where the defect is detected while the driving current for all of the sub-units 110 is being increased.

[Additional Remarks]

The present invention is not limited to the embodiments, but can be altered by a skilled person in the art within the scope of the claims. That is, an embodiment derived from a proper combination of technical means within the scope of the claims is also encompassed in the technical scope of the present invention.

(Unit of Group)

In the embodiments, a sub-unit is regarded as a group. However, the embodiments are not limited to provided that a group at least (i) includes one or more LD modules and (ii) is configured so that a driving current for the one or more LD modules can be controlled independently from another group. For example, as described in Examples, in a case where a plurality of LD drivers are included in a sub-unit, it is possible to set a plurality of groups for the respective plurality of LD drivers in the sub-unit. Note, however, that, as described in the embodiments, a unit of group is more preferably a unit in which a plurality of LD modules are integrally replaceable. According to the embodiments, the sub-unit includes the LD power source, the LD driver, the pump combiner, and the amplifying fiber. Note, however, that the sub-unit can be configured not to include at least one of the LD power source, the LD driver, the pump combiner, and the amplifying fiber. For example, the sub-unit can be configured (i) to include an LD power source, an LD driver, and an LD module and (ii) not to include a pump combiner and an amplifying fiber.

(Detection Position and Detection Method of Intensity of Laser Light)

According to the embodiments, an intensity of output light (another laser light which changes in intensity in accordance with an intensity of laser light emitted from the laser light source) outputted from the fiber laser is detected. Note however, that laser light of which intensity is to be detected is not limited to this. For example, it is possible to detect an intensity of excitation light, before being amplified by the pump combiner, an intensity of laser light before being combined with another laser light, or the like. An intensity of output, light, outputted from the fiber laser depends on an intensity of any laser light (including excitation light) which exists for generating the output light. Therefore, detection of the intensity of such laser light, is synonymous with detection of the intensity of the output light outputted from the fiber laser.

As another detection method, it is possible to notify, from an outside of the fiber laser (i.e., an output destination to which the fiber laser outputs light), a decrease in intensity of output light outputted from the fiber laser. For example, in a case where a decrease in intensity of the output light has been detected by a detecting section such as a PD in the output destination of the output light, the decrease in intensity can be notified to the control circuit 120 via communication between the detecting section and the control circuit 120. Note that the detection method of detecting an intensity of output light outputted from the fiber laser is not limited to the detection carried out by the PD. For example, in a case where a user has recognized a decrease in intensity of a laser beam (e.g., in a case where a user has recognized a decrease in intensity of a laser beam based on a value indicative of the intensity of the laser beam which value is displayed on a display or the like; in a case where a user has recognized a decrease in performance in laser processing or the like; etc.), the decrease in intensity can be notified to the control circuit 120 via an input by the user to a terminal.

(Laser Light Source)

In the embodiments, the LD module including a plurality of laser diodes is employed as an example of the laser light source. However, the embodiments are not limited to this. For example, it is possible to employ, as the laser light source, (i) an LD module including a single laser diode or (ii) a non-modularized laser diode (e.g., a laser diode which is combined with a fiber in a state of being open without a lid of a package or the like).

[Main Points]

A control method in accordance with the present invention is a control method of controlling a light source device which (i) includes a plurality of laser light sources constituting each of a plurality of groups and (ii) emits laser light from the plurality of laser light sources, the control method including the steps of: (a) detecting an intensity of the laser light or another intensity of another laser light, the another intensity changing in accordance with the intensity of the laser light; and (b) controlling a driving current so that, in a case where the intensity or the another intensity which has been detected in the step (a) is lower than a predetermined lower limit threshold, only a driving current for laser light sources belonging to a specific group predetermined among the plurality of groups is increased.

With the control method, in a case where an intensity of laser light has decreased, it is possible to stably emit output light having a given intensity, by increasing the driving current for the laser light sources. In particular, with the control method, a target group for which a driving current is to be increased is limited to a specific group. This makes it possible to concentrate, on the specific group, a risk (e.g., typically, a risk that deterioration in laser light sources is rapidly accelerated when a driving current for the laser light sources has been increased, such as a risk of acceleration of progress of deterioration in the laser light sources and a risk of an increase in rate of occurrence of defect) which is caused due to the increase in driving current. As such, laser light sources which need to be replaced can be concentrated on the specific group. This allows a reduction in time and cost which are required for replacement of the laser light sources. Moreover, it is unlikely that a laser light source which does not need to be replaced is placed, and it is therefore possible to increase use efficiency of the laser light sources. The above risk does not occur in other groups for which a driving current is not to be increased, and this allows the laser light sources to have a longer life. Therefore, it is possible to reduce a frequency of replacing the laser light sources.

The control method preferably further includes the step of: (c) switching a target group, for which a driving current is to be increased, from the specific group to one of the other groups in a case where the driving current for the specific group has reached a predetermined upper limit threshold, the other groups being included in the plurality of groups and being not the specific group.

With the configuration, even though the driving current for the specific group is increased, the driving current does not exceed the upper limit threshold. This allows the specific group to continue to operate in a relatively stable manner until the specific group is replaced.

The control method is preferably configured such that in the step (b), in a case where the target group has been switched in the step (c) from a first group which is the specific group to a second group which is included in the other groups, (i) an initial driving current for the second group after the switching is set to a driving current higher than a final driving current for the second group before the switching and (ii) an initial driving current for a group after the switching is set to a driving current lower than a final driving current for the group before the switching, the group being included in the other groups and being not the second group.

Note that, even during setting of a current, it is preferable to associate a current to be increased with a current to be reduced so that total output becomes constant as much as possible. Specifically, for example, a setting start time point and a setting end time point of the current to be increased are preferably identical to those of the current to be reduced.

With the configuration, in a case where the target group is switched from the first group which is the specific group to the second group which is included in the other groups, it is possible to concentrate, on the second group, a risk caused due to the increase in driving current, and therefore, necessity of replacement of a component can be concentrated on the second group, as with the specific group.

The control method is preferably configured such that, in the step (c), the target group is switched in a descending order of priority which has been predetermined for the other groups, the control method further including the steps of: (d) initializing a driving current so that, in a case where at least one of components has been replaced in a group for which a driving current had been increased, the driving current for the group is restored to an initial driving current; and (e) setting an order of priority so that the group for which the driving current has been restored to the initial driving current has a lowest priority.

The configuration (i) allows the laser light sources in each of the groups to have a longer life as much as possible and (ii) allows a replacement cycle of the laser light, sources in each of the groups to be longest. This makes it possible to increase use efficiency of the laser light sources while reducing time and cost which are required for replacement of the laser light sources.

The control method is preferably configured such that the driving current for the laser light sources belonging to the specific group is set in advance so as to be higher than a driving current for laser light sources belonging to the other groups.

With the configuration, it is possible to further surely concentrate, on the specific group, a risk which is caused due to the increase in driving current.

The control method is preferably configured such that each of the plurality of laser light sources is an LD module including a plurality of laser diodes.

With the configuration, since a driving current for all of the plurality of laser diodes in the LD module are uniformly increased, the plurality of laser diodes are similarly deteriorated. Therefore, it is unlikely that use efficiency of the laser diodes decreases even in a case where the laser diodes are replaced for each LD module.

The control method is preferably configured such that the target group is switched in the step (c) for each sub-unit in which a plurality of laser light sources are included in an integrally replaceable manner.

With the configuration, it is possible to integrally replace, for each sub-unit, a plurality of laser light sources for which a driving current has been increased. This allows a reduction in time and cost which are required for replacement of the plurality of laser light sources. Since a driving current for a plurality of laser light sources in a sub-unit is uniformly increased, it is unlikely that the plurality of laser light sources include a laser light source which does not need to be replaced. Therefore, it is unlikely that use efficiency of the plurality of laser light sources decreases even in a case where the plurality of laser light sources are integrally replaced. Note that a sub-unit typically includes, in addition to the laser light sources, other components (e.g., a heat radiating resin, and the like) which are deteriorated with age. With the configuration, it is therefore possible to simultaneously replace such other components.

A control device in accordance with the present invention is a control device for controlling a light source device which (i) includes a plurality of laser light sources constituting each of a plurality of groups and (ii) emits laser light from the plurality of laser light sources, the control device including: a detecting section for detecting an intensity of the laser light or another intensity of another laser light, the another intensity changing in accordance with the intensity of the laser light; and a driving current controlling section for controlling a driving current so that in a case where the intensity or the another intensity which has been detected by the detecting section is low than a predetermined lower limit threshold, a driving current for laser light sources belonging to a specific group predetermined among the plurality of groups is increased.

The control device can bring about an effect similar to that of the control method.

The light source device in accordance with the present invention is a light source device which (i) includes a plurality of laser light sources constituting each of a plurality of groups and (ii) emits laser light from the plurality of laser light sources, the light source device including: a detecting section for detecting an intensity of the laser light or another intensity of another laser light, the another intensity changing in accordance with the intensity of the laser light; and a driving current controlling section for controlling a driving current so that, in a case where the intensity or the another intensity which has been detected by the detecting section is lower than a predetermined lower limit threshold, a driving current for laser light sources belonging to a specific group predetermined among the plurality of groups is increased.

The fiber laser can bring about an effect similar to that of the control method.

INDUSTRIAL APPLICABILITY

The present invention is suitably applicable to a light source device, such as a fiber laser or a fiber amplifier, including a plurality of laser diodes as light sources. In particular, the present invention is suitably applicable to a light, source device in which a plurality of multi-chip LD modules are employed as light sources.

REFERENCE SIGNS LIST

100: Fiber laser (light source device)
110: Sub-unit
112: LD module
114: LD power source
115: LD driver
116: Pump combiner
118: Amplifying fiber
120: Control circuit (control section)
122: Driving current control section
124: Control target switching section
126: Driving current initializing section
128: Priority setting section
130: PD (detecting section)

The invention claimed is:

1. A control method of controlling a light source device which (i) includes a plurality of groups of laser light sources and (ii) simultaneously emits laser light from the laser light sources, each of the plurality of groups being made of at least one laser light source,
said control method comprising the steps of:
(a) detecting a detection target laser light intensity which is (i) an entire intensity of the laser light outputted from a whole of the plurality of groups or (ii) another intensity of laser light that is obtained at any intermediate stage in generating the laser light outputted from the whole of the plurality of groups, the entire intensity depending on the another intensity; and
(b) controlling a driving current so that, in a case where the detection target laser light intensity which has been detected in the step (a) is lower than a predetermined lower limit threshold, only a driving current for all of the at least one laser light sources belonging to a specific group predetermined among the plurality of groups is increased;
wherein the driving current for the laser light sources belonging to the specific group is set in advance so as to be higher than a driving current for laser light sources belonging to the other groups.

2. The control method as set forth in claim 1, further comprising the step of:
(c) switching a target group, for which a driving current is to be increased, from the specific group to one of the other groups in a case where the driving current for the specific group has reached a predetermined upper limit threshold, the other groups being included in the plurality of groups and being not the specific group.

3. The control method as set forth in claim 1, wherein each of the plurality of laser light sources is an LD module including a plurality of laser diodes.

4. The control method as set forth in claim 1, wherein:
the entire intensity of the laser light outputted from the whole of the plurality of groups is an intensity of laser light that has passed through an amplifying fiber.

5. A control method of controlling a light source device which (i) includes a plurality of laser light sources constituting each of a plurality of groups and (ii) emits laser light from the plurality of laser light sources,
said control method comprising the steps of:
(a) detecting an intensity of the laser light or another intensity of another laser light, the another intensity changing in accordance with the intensity of the laser light;
(b) controlling a driving current so that, in a case where the intensity or the another intensity which has been detected in the step (a) is lower than a predetermined lower limit threshold, only a driving current for laser light sources belonging to a specific group predetermined among the plurality of groups is increased; and
(c) switching a target group, for which a driving current is to be increased, from the specific group to one of the other groups in a case where the driving current for the specific group has reached a predetermined upper limit threshold, the other groups being included in the plurality of groups and being not the specific group,
wherein, in the step (b), in a case where the target group has been switched in the step (c) from a first group which is the specific group to a second group which is included in the other groups, (i) an initial driving current for the second group after the switching is set to a driving current higher than a final driving current for the second group before the switching and (ii) an initial driving current for a group after the switching is set to a driving current lower than a final driving current for the group before the switching, the group being included in the other groups and being not the second group.

6. The control method as set forth in claim 5, wherein the driving current for the laser light sources belonging to the specific group is set in advance so as to be higher than a driving current for laser light sources belonging to the other groups.

7. The control method as set forth in claim 5, wherein each of the plurality of laser light sources is an LD module including a plurality of laser diodes.

8. A control method of controlling a light source device which (i) includes a plurality of laser light sources constituting each of a plurality of groups and (ii) emits laser light from the plurality of laser light sources, said control method comprising the steps of:
- (a) detecting an intensity of the laser light or another intensity of another laser light, the another intensity changing in accordance with the intensity of the laser light;
- (b) controlling a driving current so that, in a case where the intensity or the another intensity which has been detected in the step (a) is lower than a predetermined lower limit threshold, only a driving current for laser light sources belonging to a specific group predetermined among the plurality of groups is increased; and
- (c) switching a target group, for which a driving current is to be increased, from the specific group to one of the other groups in a case where the driving current for the specific group has reached a predetermined upper limit threshold, the other groups being included in the plurality of groups and being not the specific group, wherein, in the step (c), the target group is switched in a descending order of priority which has been predetermined for the other groups, said control method further comprising the steps of:
- (d) initializing a driving current so that, in a case where at least one of components has been replaced in a group for which a driving current had been increased, the driving current for the group is restored to an initial driving current; and
- (e) setting an order of priority so that the group for which the driving current has been restored to the initial driving current has a lowest priority.

9. The control method as set forth in claim 8, wherein the driving current for the laser light sources belonging to the specific group is set in advance so as to be higher than a driving current for laser light sources belonging to the other groups.

10. The control method as set forth in claim 8, wherein each of the plurality of laser light sources is an LD module including a plurality of laser diodes.

11. A control method of controlling a light source device which (i) includes a plurality of laser light sources constituting each of a plurality of groups and (ii) emits laser light from the plurality of laser light sources, said control method comprising the steps of:
- (a) detecting an intensity of the laser light or another intensity of another laser light, the another intensity changing in accordance with the intensity of the laser light;
- (b) controlling a driving current so that, in a case where the intensity or the another intensity which has been detected in the step (a) is lower than a predetermined lower limit threshold, only a driving current for laser light sources belonging to a specific group predetermined among the plurality of groups is increased; and
- (c) switching a target group, for which a driving current is to be increased, from the specific group to one of the other groups in a case where the driving current for the specific group has reached a predetermined upper limit threshold, the other groups being included in the plurality of groups and being not the specific group, wherein the target group is switched in the step (c) for each sub-unit in which a plurality of laser light sources are included in an integrally replaceable manner.

12. The control method as set forth in claim 11, wherein the driving current for the laser light sources belonging to the specific group is set in advance so as to be higher than a driving current for laser light sources belonging to the other groups.

13. The control method as set forth in claim 11, wherein each of the plurality of laser light sources is an LD module including a plurality of laser diodes.

14. A control device for controlling a light source device which (i) includes a plurality of groups of laser light sources and (ii) simultaneously emits laser light from the laser light sources, each of the plurality of groups being made of at least one laser light source, said control device comprising:
- a detecting section for detecting a detection target laser light intensity which is (i) an entire intensity of the laser light outputted from a whole of the plurality of groups or (ii) another intensity of laser light that is obtained at any intermediate stage in generating the laser light outputted from the whole of the plurality of groups, the entire intensity depending on the another intensity; and
- a driving current controlling section for controlling a driving current so that, in a case where the detection target laser light intensity which has been detected by the detecting section is lower than a predetermined lower limit threshold, only a driving current for all of the at least one laser light sources belonging to a specific group predetermined among the plurality of groups is increased;

wherein the driving current for the laser light sources belonging to the specific group is set in advance so as to be higher than a driving current for laser light sources belonging to the other groups.

15. The control device as set forth in claim 14, wherein:
the entire intensity of the laser light outputted from the whole of the plurality of groups is an intensity of laser light that has passed through an amplifying fiber.

16. A light source device which (i) includes a plurality of groups of laser light sources and (ii) simultaneously emits laser light from the laser light sources, each of the plurality of groups being made of at least one laser light source, said light source device comprising:
- a detecting section for detecting a detection target laser light intensity which is (i) an entire intensity of the laser light outputted from a whole of the plurality of groups or (ii) another intensity of laser light that is obtained at any intermediate stage in generating the laser light outputted from the whole of the plurality of groups, the entire intensity depending on the another intensity; and
- a driving current controlling section for controlling a driving current so that, in a case where the detection target laser light intensity which has been detected by the detecting section is lower than a predetermined lower limit threshold, only a driving current for all of the at least one laser light sources belonging to a specific group predetermined among the plurality of groups is increased;

wherein the driving current for the laser light sources belonging to the specific group is set in advance so as to be higher than a driving current for laser light sources belonging to the other groups.

17. The light source device as set forth in claim 16, wherein:
the entire intensity of the laser light outputted from the whole of the plurality of groups is an intensity of laser light that has passed through an amplifying fiber.

* * * * *